United States Patent [19]
Ebinuma et al.

[11] Patent Number: 5,975,709
[45] Date of Patent: *Nov. 2, 1999

[54] REFLECTING SYSTEM

[75] Inventors: Ryuichi Ebinuma, Machida; Yutaka Watanabe, Isehara, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/234,948

[22] Filed: Apr. 28, 1994

[30] Foreign Application Priority Data

| Apr. 28, 1993 | [JP] | Japan | 5-102757 |
| Jun. 21, 1993 | [JP] | Japan | 5-149159 |
| Mar. 3, 1994 | [JP] | Japan | 6-033538 |

[51] Int. Cl.⁶ ............... G02B 5/08; G02B 7/182
[52] U.S. Cl. .............. 359/845; 359/846; 359/847; 359/868; 359/871
[58] Field of Search ................. 359/846, 868, 359/847, 869, 845, 849, 871, 726, 727

[56] References Cited

U.S. PATENT DOCUMENTS

| 1,685,032 | 9/1928 | Parsons | 359/849 |
| 4,097,126 | 6/1978 | Mahlein et al. | 359/847 |
| 4,298,247 | 11/1981 | Michelet et al. | 359/846 |
| 4,420,222 | 12/1983 | Bret et al. | 359/846 |
| 4,429,953 | 2/1984 | Zehnpfennig et al. | 359/846 |
| 4,487,196 | 12/1984 | Murphy | 359/846 |
| 4,989,226 | 1/1991 | Woodbury et al. | 359/846 |
| 5,052,033 | 9/1991 | Ikeda et al. | 378/35 |
| 5,123,036 | 6/1992 | Uno et al. | 378/34 |
| 5,125,014 | 6/1992 | Watanabe et al. | 378/34 |
| 5,128,975 | 7/1992 | Iwamoto et al. | 378/34 |
| 5,148,324 | 9/1992 | Van Amstel | 359/846 |
| 5,150,151 | 9/1992 | Mochizuki et al. | 355/53 |
| 5,172,402 | 12/1992 | Mizusawa et al. | 378/34 |
| 5,214,685 | 5/1993 | Howells | 359/846 |
| 5,220,171 | 6/1993 | Hara et al. | 250/443.1 |
| 5,390,228 | 2/1995 | Niibe et al. | 359/846 |
| 5,497,274 | 3/1996 | Soll et al. | 359/847 |

FOREIGN PATENT DOCUMENTS

| 2-71508 | 3/1990 | Japan . |
| 4-144224 | 5/1992 | Japan . |

*Primary Examiner*—Ricky D. Shafer
*Attorney, Agent, or Firm*—Fitzpatrick, Cella, Harper & Scinto

[57] ABSTRACT

A reflection system, includes a reflecting member having a mirror-finished reflection surface of a spherical shape; and a base member having a base surface of a predetermined shape; and wherein the reflection member and the base member are adhered to each other with one of the bottom surface of the reflection member and the base surface of the base member being made to follow the other to cause deformation of the spherical shape, whereby the reflection surface is formed into an aspherical shape.

12 Claims, 13 Drawing Sheets

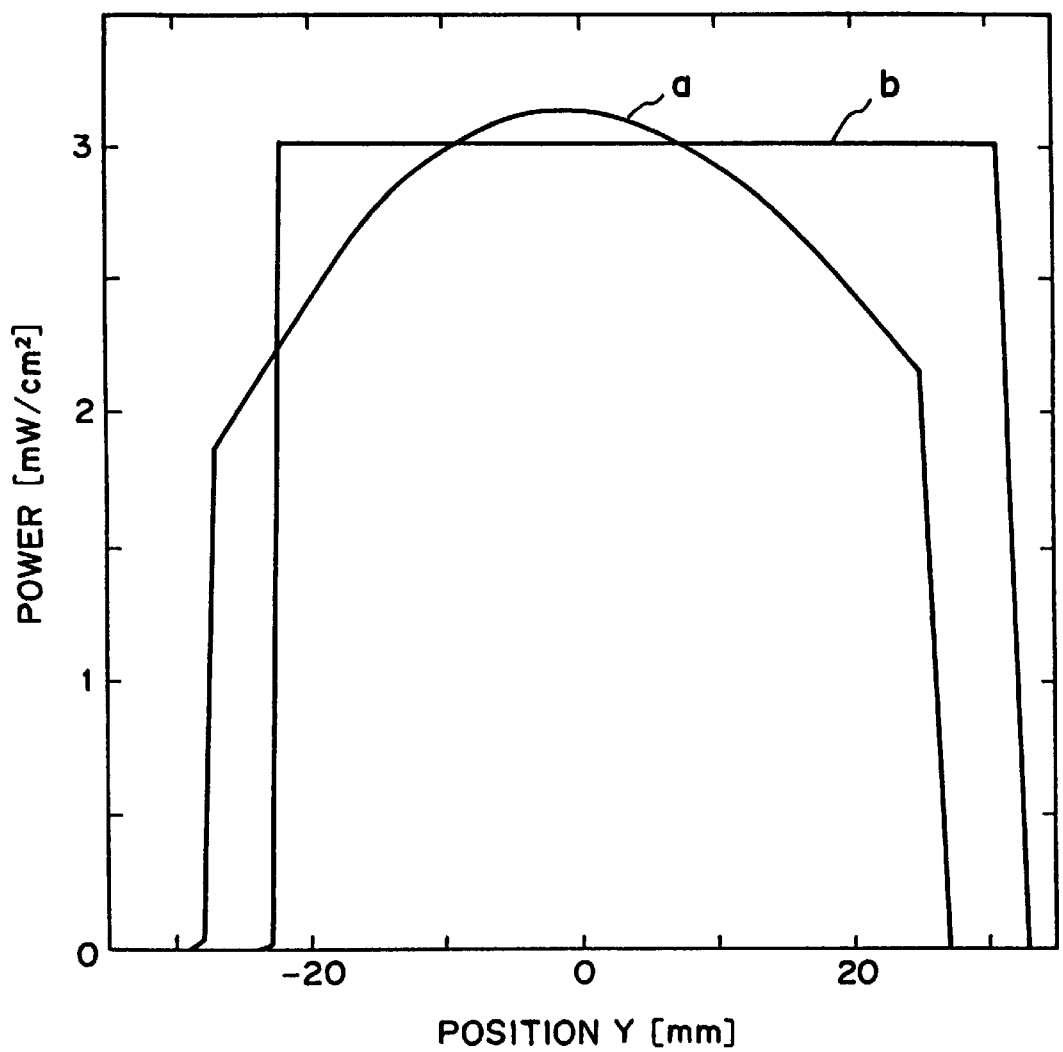
F I G. 12

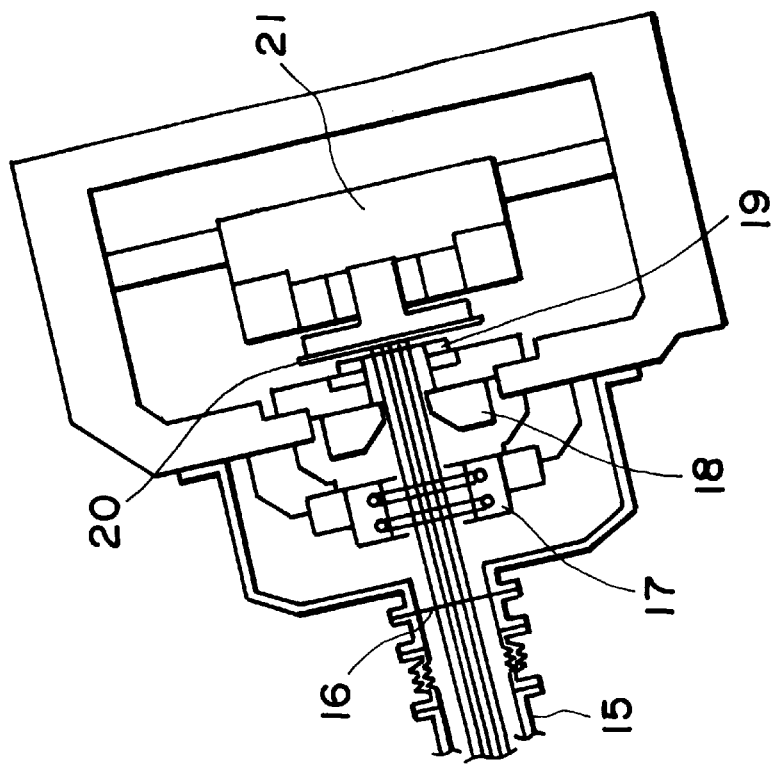
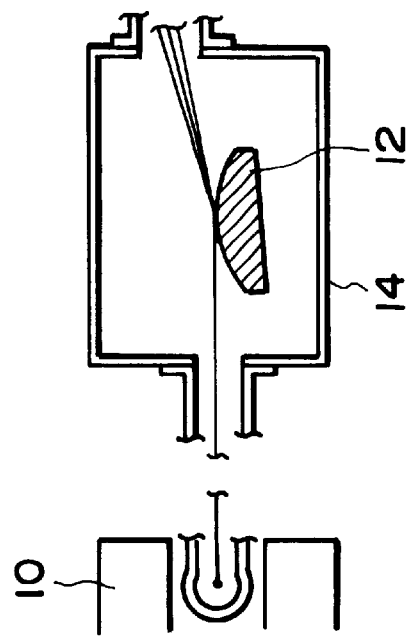
FIG. 13

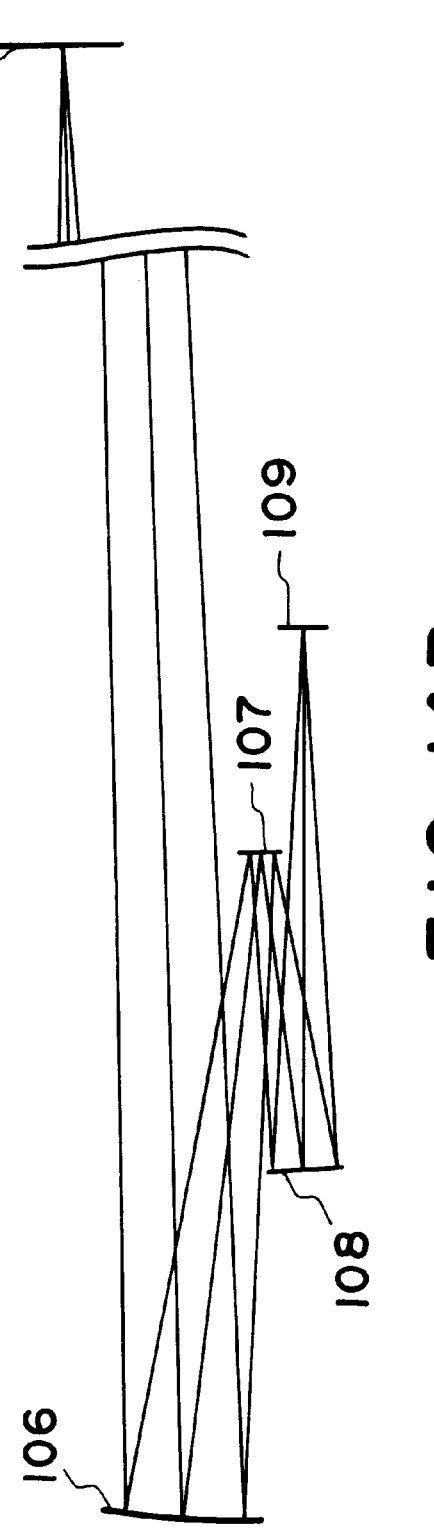

REFLECTING SYSTEM

FIELD OF THE INVENTION AND RELATED ART

This invention relates to a reflecting system suitably usable with synchrotron radiation light, for example.

An X-ray exposure apparatus for use with X-rays contained in synchrotron radiation light Is known as an example of exposure apparatuses for lithographically transferring a pattern of a mask onto a resist of a wafer. Synchrotron radiation light can be produced by a synchrotron orbital radiation (SOR) device in which light is diverged along an orbital plane of electrons. The synchrotron radiation light has a large extension along a horizontal direction, whereas, along a vertical direction, it has a small diverging angle of on an order of a few milliradians.

For this reason, in order to assure an exposure region of having a size of a few centimeters, as required by an X-ray exposure apparatus, it is necessary to expand the synchrotron radiation light in the vertical direction. A reflection mirror for reflecting X-rays can be used as such expanding means. More specifically, a reflection mirror having a reflection surface of a convex shape can expand light. It is relatively easy to machine a mirror member to form its reflection surface into a cylindrical surface shape and, therefore, proposals have been made to use a mirror member having a reflection surface of having a cylindrical shape, as an expanding mirror.

The synchrotron radiation light has an intensity distribution of approximately Gaussian shape, along the vertical direction. If a mirror being used has a reflection surface of a convex cylindrical shape, the synchrotron radiation light reflectively expanded by the mirror has an intensity distribution of approximately a Gaussian shape. As a result, the intensity of illumination in the exposure region is non-uniform. In the X-ray exposure apparatus, however, uniform exposure should be attained within the exposure region. Therefore, it is necessary to make uniform the exposure amount within the exposure region, by using suitable measures.

Japanese Laid-Open Patent Application, Laid-Open No. 144224/1992 discloses the use of a mirror having a reflection surface of a specific shape to attain substantially uniform illumination intensity. More specifically, the shape of a reflection surface of a mirror being used is not cylindrical, but aspherical, having a varying radius of curvature.

SUMMARY OF THE INVENTION

The inventors of the subject application have found that the manufacture of such an aspherical reflection surface involves a problem. Namely, an exposure apparatus for synchrotron radiation light uses illumination light of X-rays having a wavelength of about 1 nm. In order to assure reflection of light of such a wavelength region, the reflection surface must be smooth with respect to "1 nm". If the shape of the reflection surface is flat, spherical or cylindrical, the shape precision and smoothness can be assured by finishing the surface of a mirror member with a polishing member of a mating shape. However, this process does not apply to a mirror member having a reflection surface of aspherical shape. Practically, it is not easy to finish the surface into a mirror surface (with respect to 1 nm) of aspherical shape.

It is accordingly an object of the present invention to provide a reflection system by which difficulties in making an aspherical reflection surface of good precision can be reduced.

It is another object of the present invention to determine an optimum structure and/or optimum dimension of such a reflection system.

It is a further object of the present invention to provide an illumination system having a reflection system such as above.

It is yet a further object of the present invention to provide an exposure apparatus having a reflection system such as above.

It is a still further object of the present invention to provide a device manufacturing method using a reflection system such as above.

In one aspect of the present invention, there is provided a reflection system which includes a reflection member having a mirror-finished reflection surface and a base member having a base surface of a predetermined shape, wherein the reflection member and the base member are attached to each other and wherein one of the bottom surface of the reflection member and the base surface of the base member is made to follow the other so that the reflection surface is formed into an aspherical shape.

In another aspect of the present invention, there is provided a reflection system which includes a reflection member having a mirror-finished reflection surface of a cylindrical shape and a base member having a base surface of a predetermined shape, wherein the reflection member and the base member are attached to each other and wherein one of the bottom surface of the reflection member and the base surface of the base member is made to follow the other so that the curvature of the cylindrical reflection surface is locally changed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 12 is a graph for explaining an illumination intensity distribution.

FIG. 13 is a schematic view of an embodiment of an X-ray exposure apparatus.

FIGS. 14A and 14B are schematic views of an embodiment of a reduction projection type X-ray exposure apparatus.

DESCRIPTION OF THE PREFERRED EMBODIMENTS

Embodiment 1

A first embodiment of the present invention will now be explained. It is to be noted that reflection systems to be explained below can suitably be used not only with synchrotron radiation light but also with short-wavelength light, particularly, light of a wavelength shorter than that of ultraviolet light.

Figure 1:
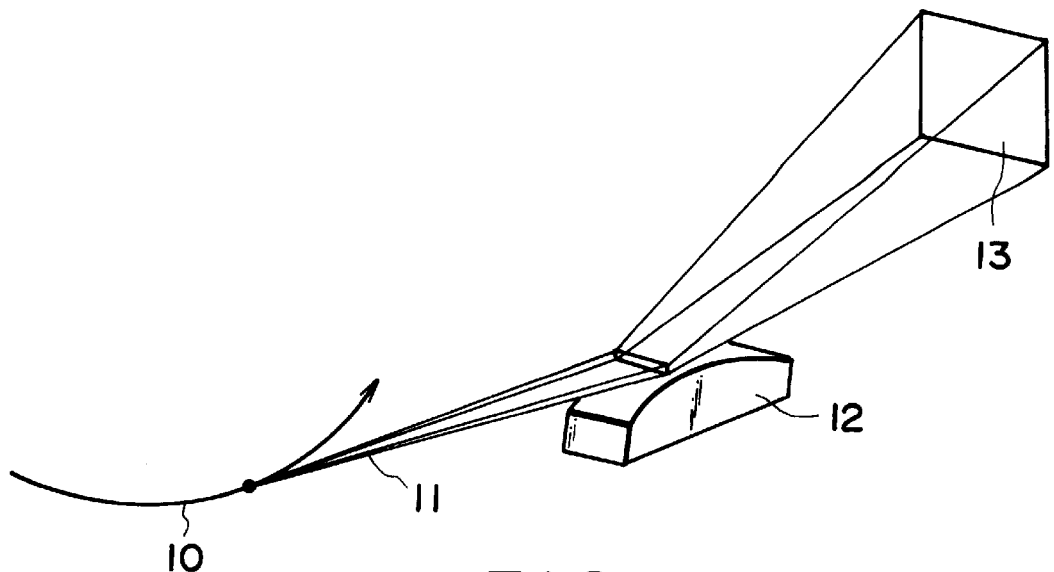
FIG. 1 is a schematic view for explaining the manner of expanding synchrotron radiation light with an X-ray mirror.

FIG. 1 is a schematic view of an X-ray illumination system which includes a reflection system for expanding synchrotron radiation light. Synchrotron radiation light 11 of a sheet beam shape, emitted by an electron accumulation ring 10 of an SOR system, is reflectively expanded by an X-ray mirror 12 in a direction perpendicular to the orbital plane. To this end, the, X-ray mirror 12 is formed with a reflection surface of a shape having a convex curvature in the direction of the optical axis. For enhanced X-ray reflection efficiency, the reflection surface is finished with a material of silicon carbide, for example, with a surface roughness of on an order of a few angstroms and, additionally, the mirror is disposed with a glancing angle of on an order of 10–20 mrad with respect to the light incident thereon.

The synchrotron radiation light 11 emitted from the electron accumulation ring 10 has a uniform intensity distribution along a horizontal direction (orbital plane), but it has an intensity distribution of a Gaussian distribution shape in the vertical direction. For attaining a uniform intensity distribution in the vertical direction, over an illumination region 13, it is effective to diverge the central portion of the synchrotron radiation light and to converge the peripheral portion thereof. To this end, the reflection surface of the X-ray mirror 12 has such a shape that the expanding rate is large (curvature radius is small) at the central portion, but it is small (curvature radius is large) at the peripheral portion.

Figure 8:
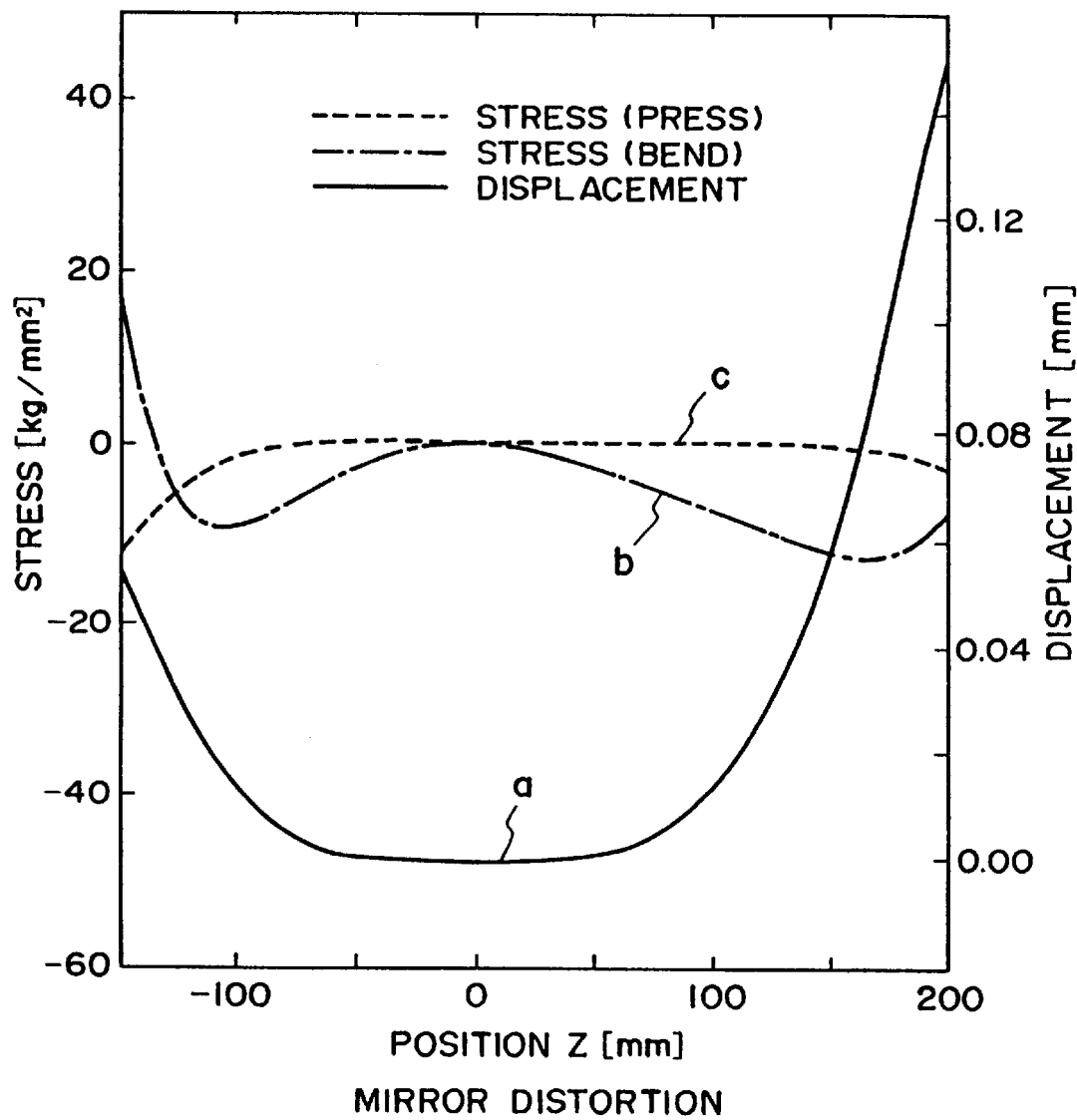
FIGS. 8–11 are graphs each for explaining an example of an aspherical shape of a reflection system and stress.

Curve a in the graph of FIG. 8 represents such a reflection surface shape. The axis of the abscissa corresponds to the direction of an optical axis (Z direction) along the reflection surface of the mirror. The axis of the ordinate corresponds to a deviation from the cylindrical shape (uniform curvature). The curve a represents a mirror reflection surface shape which is so determined by calculation that the synchrotron radiation light is converged in the vertical direction to assure uniformness in the exposure region of the energy absorbed by a photosensitive material of a wafer. As seen from the drawing, the reflection surface of this example has an aspherical shape.

FIG. 12 is a graph for comparing differences in illumination intensity distribution due to the shape of a mirror reflection surface being used. The axis of the abscissa represents the position with respect to the vertical direction of the exposure region of a wafer, and the axis of the ordinate represents the energy of illumination light as absorbed by a photosensitive material applied to a wafer. Curve a depicts the illumination intensity distribution, at the wafer position, in a case where a conventional X-ray mirror of a cylindrical surface shape is used in an illumination system. Curve b corresponds to a case where an aspherical mirror such as depicted by curve a in FIG. 8 is used. According to calculation, a substantially uniform illumination intensity distribution is attainable with this mirror.

Figure 2A:
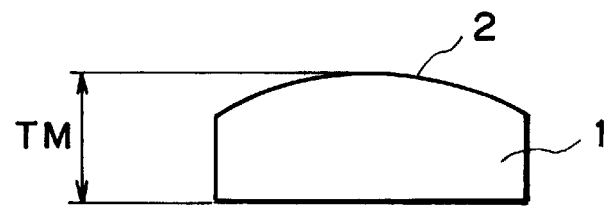
FIGS. 2A–2C are schematic views for explaining a reflection system according to an embodiment of the present invention.
Figure 2B:
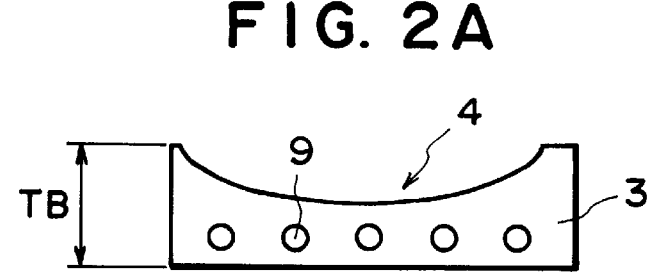
Figure 2C:
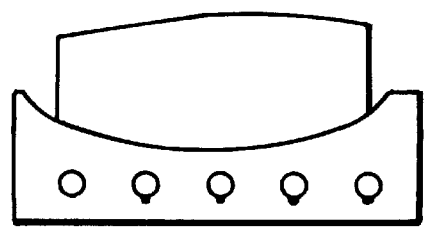

FIGS. 2A–2C are schematic views for explaining the manner of forming a mirror having such an aspherical surface shape. FIG. 2A shows a mirror member 1 having a reflection surface 2. The mirror member 1 may be made of a material such as silicon carbide or silica, for example, which can be machined to obtain a small surface roughness. The reflection surface 2 is machined into a cylindrical surface shape or spherical surface shape, close to a desired aspherical surface shape. The surface finishing is easy if the surface is of a cylindrical shape or a spherical shape. Through a pitch polishing process in which the surface of a mirror member, to be processed, and a pitch member of a shape mating with that of the mirror member, are slidingly moved relative to each other while using an abrasive material, a surface roughness of on an order of a few angstroms is obtainable. The bottom surface of the mirror member 1, remote from the reflection surface 2, is finished by polishing to attain flatness of good precision.

FIG. 2B shows a base member 3 which serves to hold the mirror member 1 and to cause deformation of the same. The base member may be made of a metal such as stainless steel, for example. The base member 3 has a base surface 4 which is machined by using an NC (numerical control) grinding machine, for example, such that is has a shape corresponding to the difference between a desired aspherical reflection shape and the shape (cylindrical or spherical shape) of the formed reflection surface 2 of the mirror member 1, i.e., corresponding to the amount of asphericity only. Although the precision of surface roughness required for the base surface 4 is not high as compared with that of the reflection surface 2 of the mirror member 1, small surface roughness is desirable for good thermal transmission with the base member 1. Additionally, the base member 3 is provided with flow passageways 9 formed therein, for flowing cooling water for cooling the mirror member 1.

FIG. 2C illustrates a subsequent step in which the bottom surface of the mirror member 1 (FIG. 2A) and the base surface 4 of the base member 3 (FIG. 2B) are intimately contacted to each other and, by applying a stress from the bottom surface side of the mirror member 1, the reflection surface 2 is deformed, whereby a reflection surface of a desired aspherical shape is formed.

A layer of a material of good heat conductivity, such as an indium film, for example, may be interposed between the mirror member 1 and the base member 3. This is effective to increase the heat conduction from the mirror to the base member and, therefore, to improve the mirror cooling effect. On that occasion, the indium film may desirably have a uniform thickness. If there is a possibility of non-uniform deformation of the indium film due to a difference in pressing force, it is desirable to correct or compensate the deformation when the base member shape is machined.

Figure 3:
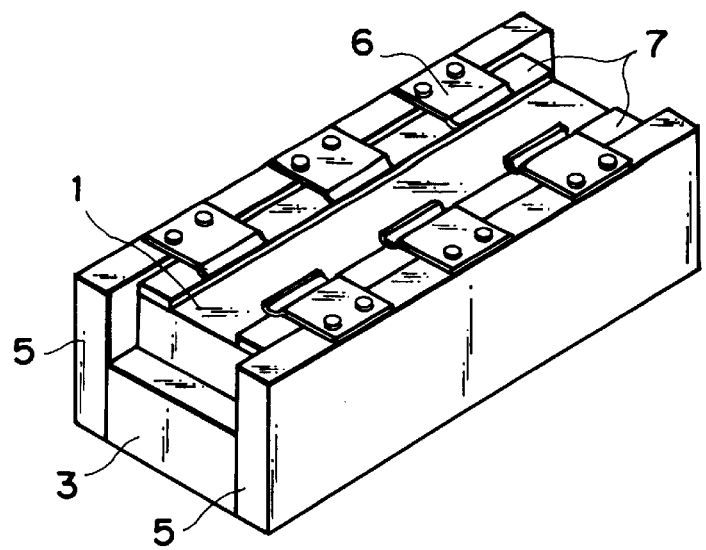
FIG. 3 is a perspective view of a reflection system according to an embodiment of the present invention.

FIG. 3 is a perspective view of an embodiment of a reflection system according to the present invention. The structure of this embodiment is convenient in the point of control of the amount of deformation of the mirror member. Holding members 5 are attached to the opposite sides of a base member 3. Mirror member 3 is pressed against the base member 3 by means of spring members 6, mounted to the holding members 5, and through intermediate plates 7. Due to this pressing force, the mirror member 1 is deformed by an amount corresponding to the amount of asphericity applied to the base surface of the base member 3. As a result, the reflection surface of the mirror member 1 is formed into d desired aspherical shape.

In order to assure exact matching between the amount of deformation of the bottom surface of the mirror member 1 and the machined shape of the base surface 4 of the base member 3, both the holding member 5 and the base member 3 should desirably have a high rigidity with respect to the direction of deformation and, additionally, the mirror member 1 should desirably have a low rigidity with respect to the direction of deformation. Also, the combined rigidity of the holding member 5 and the base member 3 should be higher than that of the mirror member 1. To this end, it is effective to make the thickness of the base member 3 larger than that of the mirror member 1. However simply enlarging the thickness of the base member leads to increased total size and total weight. On the other hand, in order to assure good matching between the amount of deformation of the reflection surface of the mirror member 1 and the bottom surface thereof, a smaller thickness of the mirror member 1 is desirable. However, since the mirror member 1 should have a rigidity sufficient for retaining the surface shape during the surface finishing process, there is a limitation in reducing the flexural rigidity.

In order to assure a good efficiency of reflection of light in X-ray wavelength region, to be used in the an exposure apparatus, the surface of the mirror member should be polished to provide a sufficiently smooth surface roughness with respect to the X-ray wavelength. To satisfy this requirement, the mirror member may preferably be made of a material such as silica, silicon or silicon carbide, for example, rather than a metal material. However, since these materials each cannot easily be threaded, the thread coupling is difficult to be adopted. In consideration of this, when a mirror member of such a material is used and an external force is to be applied to the mirror member to cause deformation thereof, area loads for producing the pressing force may be applied to two opposed surfaces which are perpendicular to the direction of deformation. This is particularly effective when a mirror member, whose thickness is small as compared with the length thereof, is to be bent.

In order to satisfy these requirements, in the arrangement of FIG. 3, two holding members 5 are disposed to sandwich the mirror member 1 therebetween, and the base member 3 is disposed to couple corresponding and portions of these holding members 5. Also, spring members 6 are mounted to the other end portions of the holding members, so as to apply the pressing force to the top and bottom surfaces of the mirror member from the spring members and the base member. With this structure, loads can be distributed to a wide area such that the area load due to the pressing force can be made small. Further, since the load is applied by using the spring members 6 having a relatively large design latitude in relation to the rigidity, it is easy to control the pressing force from the mirror surface. Therefore, the amount of deformation of the mirror member 1 can be determined in accordance with the shape of the base member 3. Additionally, it is possible to control the pressing force so that a pressing force necessary for and sufficient for assuring contact between the bottom surface of the mirror member 1 and the base surface of the base member 3 is applied. This is also effective to avoid application of an unwanted area load to the mirror member 1. With the structure shown in FIG. 3, as described, the stress produced in the mirror member 1 is reduced and, on the other hand, the latitude of deformation of the mirror member 1 is enhanced.

Figure 4:
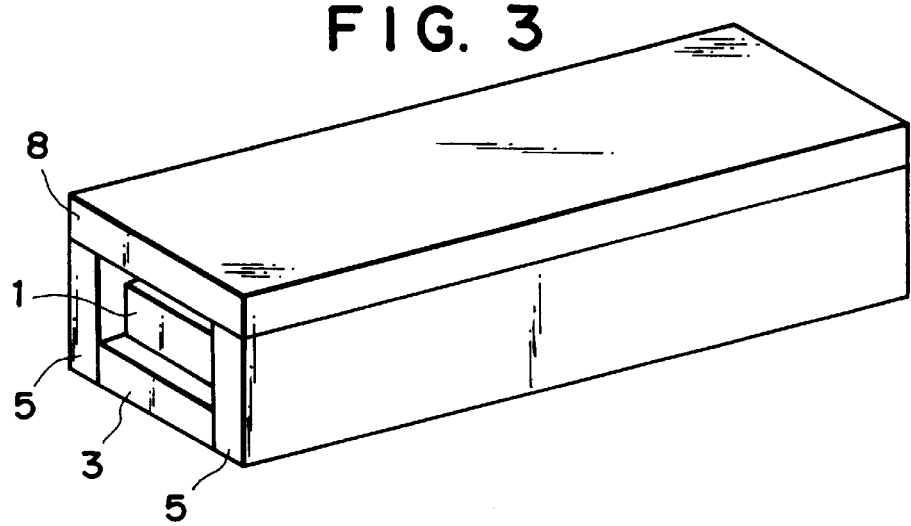
FIG. 4 is a perspective view of a reflection system according to another embodiment of the present invention.
Figure 5:
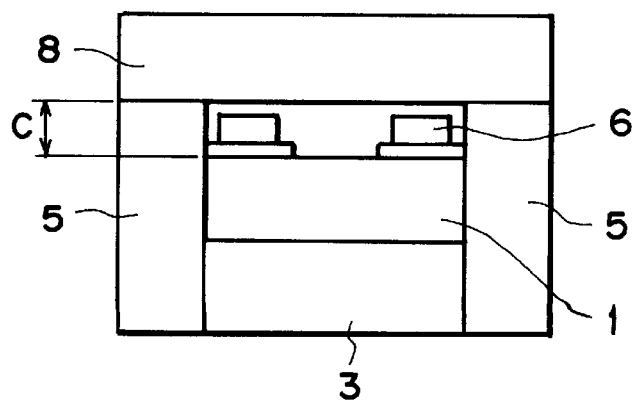
FIG. 5 is a sectional view of the reflection system of the FIG. 4 embodiment.

FIG. 4 shows another example. In this structure, as a means for holding a mirror member 1, a reinforcing member 8 is disposed at a position opposed to a base member 3 so that the mirror member 1 is supported and surrounded by these members. FIG. 5 is a sectional view of the FIG. 4 structure. By mounting the spring members 6 to the reinforcing member, the efficiency of space utilization is high and the overall size is made small. With this arrangement, it is possible to assure the rigidity of the structure for supporting the mirror member 1, with an external dimension smaller than that of the FIG. 3 embodiment.

The arrangement of FIG. 4 is suitable for an optical system which uses a total reflection region of X-rays. The synchrotron radiation light has a small expansion in the vertical direction, which is only a few millimeters even at the position spaced by a few meters from the point of light emission. When X-rays of a wavelength of about 1 nm are to be totally reflected for X-ray lithography in a proximity type X-ray exposure apparatus, the glancing angle between the mirror surface and the X-rays is about 10–30 mrad. If, for example, X-rays of a size 3 mm with respect to the vertical direction is to be received at the position of the mirror and when the glancing angle is 15 mrad, the reflection surface of the mirror member should have an effective region of a size of about 200 mm in the direction of the optical axis. The dimension of the mirror member in the direction of the optical axis has to be larger than the effective region, in consideration of bending stress setting (to be described later). If, for example, the size of the mirror member 3 in the direction of the optical axis, while taking into account this, is 400 mm and when the length of the base member 3 and the reinforcing member 8 in the direction of the optical axis is made larger by 50 mm than the mirror member 3, the spacing C (FIG. 5) between the reflection surface of the mirror member 1 and the reinforcing member 8 may be not smaller than about 4.9 mm. In the reflection system of this embodiment which is adapted to use total reflection of X-rays, the reinforcing member 8 can be disposed at a position spaced by a small distance from the reflection surface of the mirror member 1 and in a manner surrounding the reflection surface as a whole. Also, the spring members 6 are disposed in the clearance between the reinforcing member and the reflection surface of the mirror member 1 without largely damaging the flexural rigidity of the structure that comprises the base member 3, the holding members 5 and the reinforcing member 8.

In summary, the present embodiment which uses a reinforcing member 8 has advantageous features such as follows;

(1) For deformation of the mirror member, the rigidity of the supporting structure is assured with minimum outside dimensions.

(2) The spring members for pressing the mirror member can be disposed with a good space efficiency, (3) The reflection surface of the mirror member is protected during the assembling operation.

Next, deformation of the mirror member and optimum shape of the mirror member corresponding thereto, will be explained. When the mirror member is deformed in the manner described hereinbefore, in the mirror member there are produced a bending stress due to the deformation as well as a compressive stress due to the pressing by the spring members. In the graph of FIG. 8, curve a denotes an example of deformation, while curves b and c depict the stresses produced in the mirror in response to the amount of deformation of the curve a. Curve b corresponds to the bending stress, while the curve c corresponds to the compressive stress. Although the effective region of the mirror member for reflecting X-rays cannot be used as a surface to which the pressing force of the spring member is to be applied, the compressive stress of the curve c is calculated on an assumption that the pressing force of the spring member is applied also to the effective region. Actually, since a similar pressing force is applied to such a region of the central portion of the mirror member surface, excluding the effective reflection region, a larger pressure is applied to the surface and, thus, the compressive stress due to the pressing force necessary for producing the bending stress of the curve b (FIG. 5) becomes larger than the value as represented by the curve c. While detailed analysis corresponding to the manner of pressing may be necessary to determine the magnitude of stress exactly, the stress to be calculated on an occasion when the whole mirror surface is pressed may provide an effective index for estimation of the stress to be produced actually. In the following description, for better understanding of the tendency of stress production, explanation will be made with reference to a stress to be produced in a case when the pressing force is applied to the width of the mirror surface.

Figure 9:
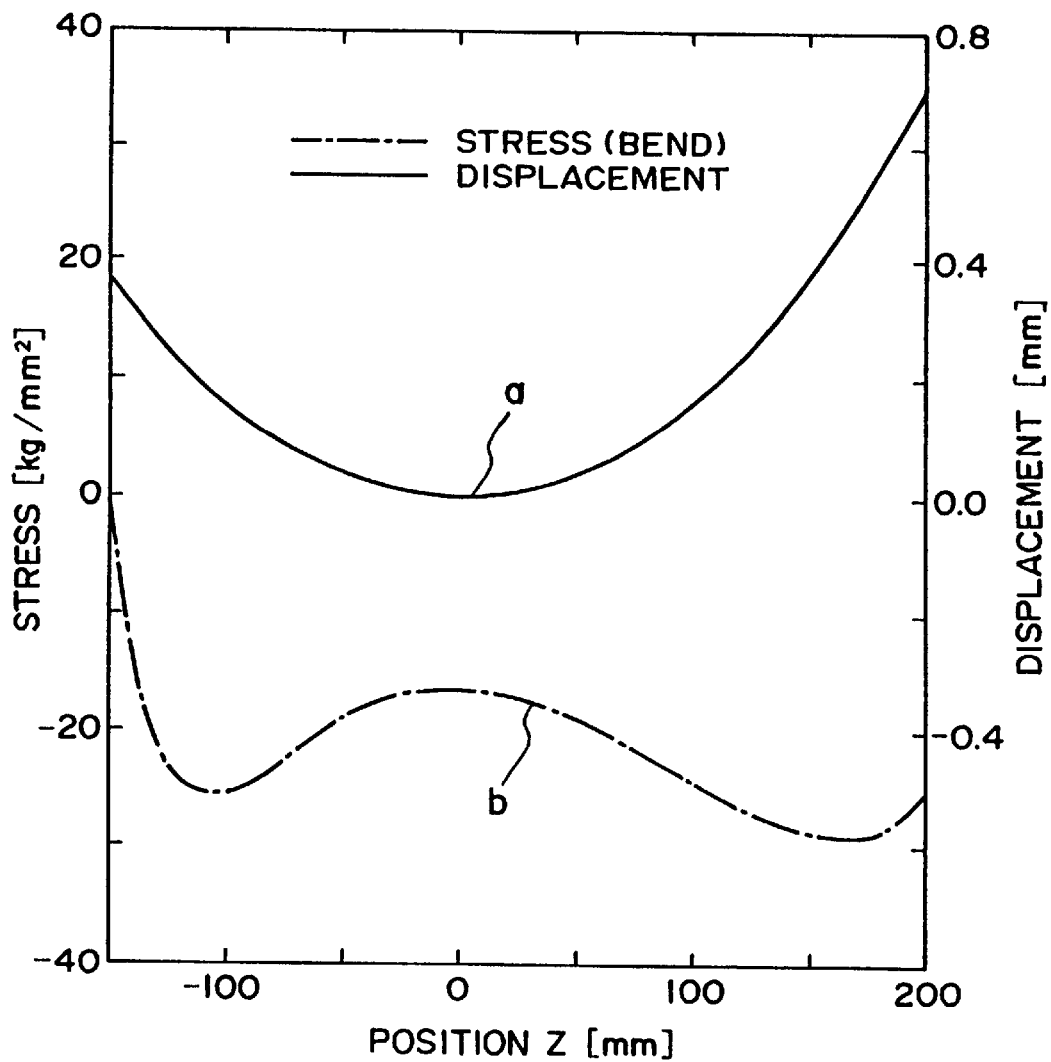
Figure 10:
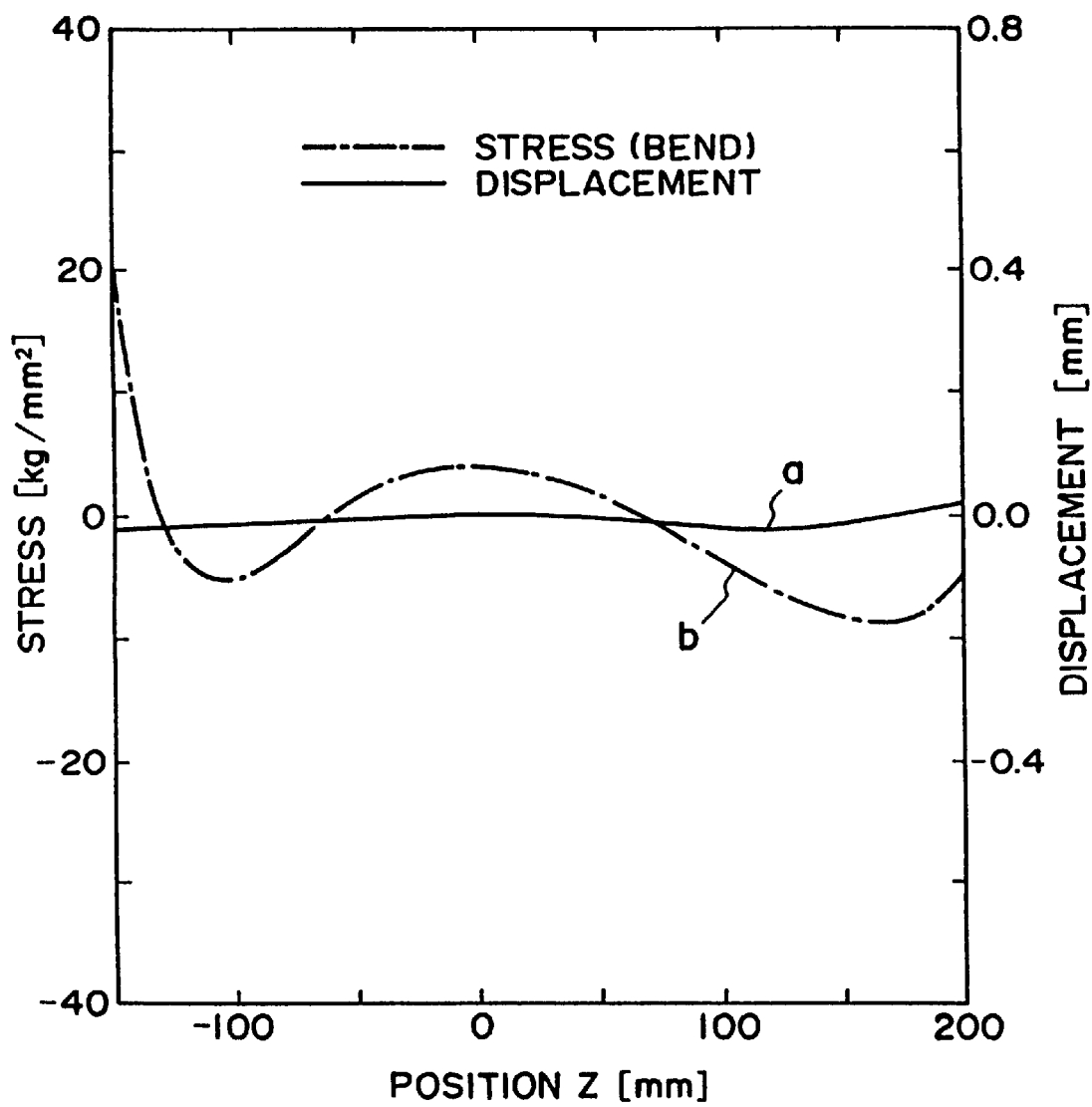
Figure 11:
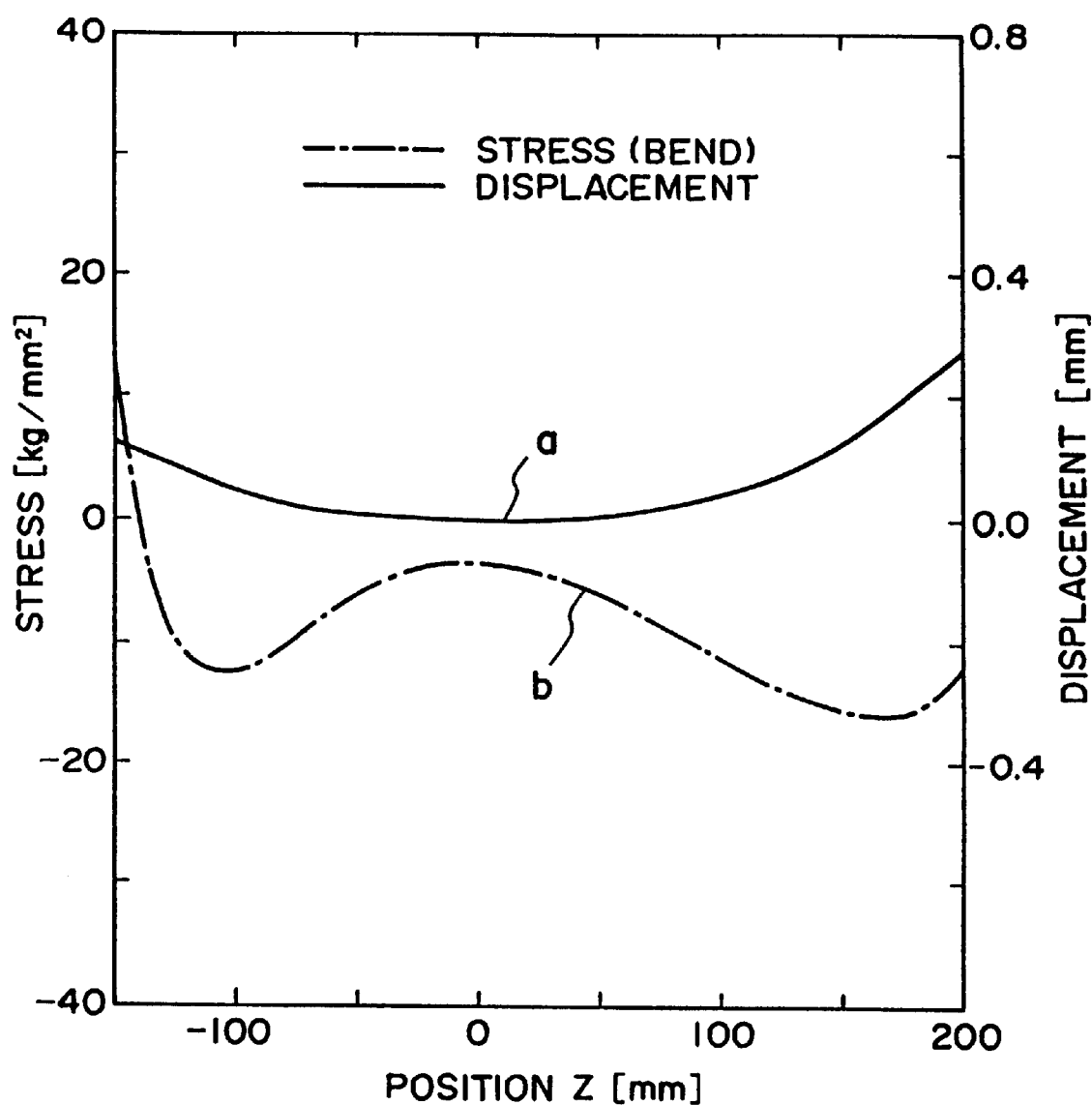

FIGS. 9–11 are graphs illustrating different examples of deformation of a mirror member, for obtaining the same non-cylindrical surface configuration, and bending stress of the mirror member surface produced in response to the deformation. The values are calculated on an assumption that the mirror member has a thickness of 30 mm and a modulus of the elasticity of 40000 kg/mm$^2$. Examples of FIGS. 9, 10 and 11 are different in the point of the curvature of the cylindrical surface, which is machined on the mirror member beforehand. Thus, they are different from each other in the amount of deformation. FIG. 9 is a case where the reflection surface of the mirror member is machined into a flat surface. The amount of deformation of the mirror member is therefore larger than that of the examples of FIGS. 10 and 11. Also, the maximum bending stress is larger than that of the other examples. FIG. 10 corresponds to a case where the reflection surface of the mirror member is machined to have a curvature radius of 29.3 m. The amount of deformation of the mirror member in this example is smaller than that of the examples of FIGS. 9 and 11. FIG. 11 corresponds to a case where the reflection surface of the mirror member is machined to have a curvature radius of 46.3 m, and the maximum bending stress of this example is smaller than that of the examples of FIGS. 9 and 10.

As seen from these graphs, by machining the reflection surface of the mirror member beforehand into a cylindrical shape or spherical shape, with respect to the direction in which the asphericity is to be defined, it is possible to reduce the stress to be produced in the mirror member as it is deformed into a non-cylindrical surface shape or aspherical surface shape. It is to be noted that the curvature of a cylinder or a sphere to be formed beforehand should not necessarily be one closest to a desired aspherical shape (i.e., the one which leads to minimum deformation). Further, although only the bending stress has been explained with reference to FIGS. 9–11, where the pressing force is applied in the direction to the base member from the reflection surface side of the mirror member to cause deformation of the mirror member as described, a compressive stress is also produced. Therefore, the curvature of the reflection surface to be defined beforehand should desirably be determined while taking into account these stresses.

When a member is fixed to a mass of a member by external force, the external force should be balanced. When the pressing force is applied only from the reflection surface of the mirror member and the bottom surface thereof, it is necessary that the combined force in the pressing direction is balanced and that the moment applied to the mirror member due to the pressing force is balanced. According to the curved beam theory, this condition may be equivalent to that, at the opposite end surfaces of the mirror member in the direction of the optical axis, the bending stress and the shearing stress are equal to zero. This applies naturally, if the opposite end faces are open as shown in FIGS. 3 and 4. Since the stress is determined by the amount of deformation, what is described above means that, when no external force is applied to the opposite end faces, the deformation is one that renders the bending stress and the shearing stress at the opposite ends equal to zero. Therefore, when the amount of deformation is determined through the supporting structure such as illustrated in FIG. 3 or 4, by taking into account this, it becomes possible to produce a desired amount of deformation very precisely.

In FIGS. 8–11, the axis of the abscissa denotes the position of the mirror member in the direction the optical axis. In these calculation examples, the stress which is to be produced in the mirror member in response to the deformation necessary for providing an illumination intensity (the strength of absorption by a photosensitive material) as depicted by curve b in FIG. 12, is calculated with respect to the portion substantially at the effective region of the mirror reflection surface. In the neighborhood of the outside peripheral portion of the effective region, the bending stress or shearing stress (proportional to the differentiation of the bending stress with respect to the position of the mirror member in the direction of the optical axis) does not become equal to zero. If, therefore, the mirror member has a length of 350 mm, substantially the same as the effective region, it is seen that, in order to obtain deformation such as illustrated, a predetermined bending stress should be applied to the opposite end faces. As described hereinbefore, in the supporting structure of FIG. 3 or 4, it is difficult to apply a force to the end face. In consideration of this, when the supporting structure such as shown in FIG. 3 or 4 is used, the deformation setting may be done so as to satisfy the following relation:

$$d^2V/dZ^2=(Z^2-L^2/4)^2 f(Z)$$

where Z is the position in the direction of the optical axis wherein the center of the mirror member is taken as an origin; V is the amount of deformation; L is the length of the mirror member in the direction of the optical axis; and f(Z) is a smooth function.

Figure 6:
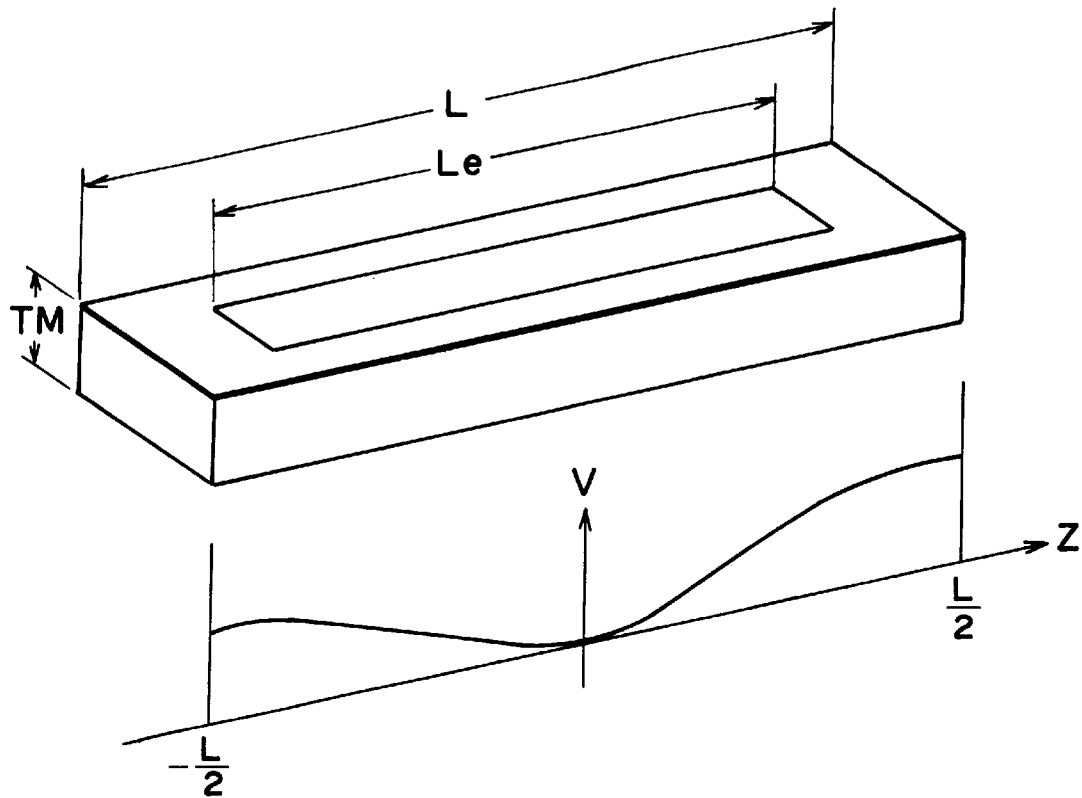
FIG. 6 is a schematic view for explaining an optimum dimension of a mirror member.

Actually, the amount of deformation will be given in discrete numerical values. In any event, it is desirable that, when the amount of deformation of the mirror member is expressed by a function of the position in the direction of the optical axis, the second- and third-stage differential coefficients of that function become equal to zero at the opposite end portions. The relation mentioned above satisfies this condition. The deformation setting for making uniform the Gaussian distribution of the synchrotron radiation light in the vertical direction, leads to enlarging the curvature radius of the reflection effective surface of the mirror member, along the direction from the center to the periphery. If, therefore, the shearing stress at the end portion of the reflection effective surface is set to be equal to zero, a large pressing force is required. Since this results in a possibility of production of a large compressive stress greater than the strength of the mirror member, it is practically difficult to adopt. An effective measure for solving this problem may be making the length L of the mirror member in the optical axis direction sufficiently larger than the length 1e of the effective region of the reflection surface. More particularly, the length L may effectively be determined in a range which satisfies the following relation (see FIG. 6):

$$L-Le>½Le$$

Further, it is effective also to determine the relationship between the thickness TM of the mirror member and the length L of the mirror member in the optical axis direction, so as to satisfy the following relation (see FIG. 6):

L-Le>TM

For reducing the bending stress due to deformation, the thickness TM of the mirror member should desirably be made small. On the other hand, for reducing the compressive stress due to the pressing by the spring member, the thickness TM of the mirror member should desirably be made small and, additionally, the area in which the pressing force of the spring member is applied toward the reflection surface side of the mirror member should desirably be made large. Also, the curvature radius of the cylinder or sphere of the formed shape of the reflection surface of the mirror member should desirably be selected to make the sum of these stresses minimum.

Figure 7:
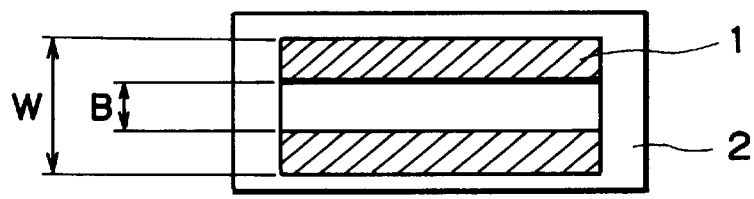
FIG. 7 is a top plan view of the reflection system.

FIG. 7 is a top plan view of the reflection surface of the mirror member. Reference character W denotes the width of the mirror member, while reference character B denotes the size of the effective reflection surface to be used as the reflection surface. The compressive stress due to the pressing by the spring member can be reduced by enlarging the area in which the pressing force of the spring member is applied toward the reflection surface side of the mirror member. An effective measure to accomplish this may be enlarge the regions depicted by hatching in FIG. 7 and, additionally, disposing intermediate plates so that the pressing force of the spring member is distributed to the hatched portion. A suitable material of such an intermediate plate may be a relatively soft metal such as copper or gold, for example, or a resin such as polyimide, for example. Further, in a reflection system as of the present embodiment which is used to reflect X-rays of synchrotron radiation light, the mirror member is disposed in a vacuum container. In consideration of this, the material of the intermediate plate may desirably be one having a property of low degasification amount type, adapted for use in a vacuum.

When the surface of the mirror member is processed to provide a surface shape of high precision attention should be paid in relation to the size of the mirror member. As regards the thickness Tm of the mirror member, it should be large enough to retain the surface shape at least during the machining operation. Also, during the polishing operation, there is a possibility of sags or roll-over in the peripheral portion. Thus, the width W has to be sufficiently larger than the size B of the effective reflection surface. Taking into this account, the width (W-B) of the hatched region of the mirror member should desirably be made larger than the size B of the reflection effective surface (see FIG. 7).

As described, the length (L-Le) of the portion outside the effective region of the reflection surface of the mirror member may be made sufficiently large and, additionally, the shape of the base surface of the base member is determined so as to produce such deformation as providing a desired aspherical shape within the effective region and as making, in the portion outside the effective region, the bending stress and shearing stress at the opposite end portions of the mirror member both equal to zero. This assures a desired shape of a reflection surface, without producing unnecessary stress in the mirror member. Further, irrespective of enlargement of the mirror thickness, the stress produced by deformation can be reduced. As a result, improved surface shape precision is assured during the polishing operation of the mirror reflection surface.

Embodiment 2

Next, a description will be made of an embodiment of the present invention in which a reflection system such as described above is applied to an exposure apparatus for use with a light source that provides synchrotron radiation light. FIG. 13 illustrates the general arrangement. Synchrotron radiation light emitted by an electron accumulation ring 10 is reflectively expanded by an X-ray mirror 12 disposed in a mirror chamber 14. The X-ray mirror 12 has a reflection surface which is manufactured in the manner such as described hereinbefore. The expanded radiation light goes through a vacuum duct 15, a vacuum partition 16 of beryllium, for example, and a shutter unit 17, and it is projected on a mask 19. Stage 21 serves to move a wafer 20 relative to the mask 19. The state of alignment of the mask 19 and the wafer 20 is detected by means of an alignment optical system 18, and the relative position of them is adjusted on the basis of the detection.

The mask 19 comprises a base plate of silicon nitride of a thickness of 1–2 microns on which a pattern to be transferred to a wafer is formed. The pattern comprises gold, tor example, having a thickness of about 0.7 micron. Most of the projected X-rays can be absorbed by this pattern. X-rays passing through the mask 19 impinge on a photosensitive material applied to the wafer 20, which is disposed in proximity to the mask. By this, a latent image of the mask pattern is formed on the water. For higher productivity of the exposure apparatus, it is desirable that the illumination light to be absorbed by the photosensitive material has a high intensity. Also, with respect to the uniformness of the linewidth precision of a pattern to be formed on the wafer, the intensity should desirably be uniform within the exposure region.

With a reflection system as described with reference to FIG. 8, the photosensitive material applied to a wafer can be exposed with uniform intensity. Actually, however, due to difficulties in exactly estimating the intensity distribution of the synchrotron radiation light in the vertical direction, stableness of the estimated intensity distribution and the possibility of differences in the absorbed intensity distribution within the exposure region depending on a photosensitive material used, there is a limitation to attaining a highest uniformness of exposure relying on the shape of the reflection surface.

In the present embodiment, in consideration of this, a reflection system such as described before is used in combination with a shutter 17 which serves to provide different exposure time periods at different locations within the exposure region, so as to assure improved exposure uniformness.

Japanese Laid-Open Patent Application, Laid-Open No. 2-71508/990 discloses a shutter device and control thereof, for providing different exposure time periods at different locations in an exposure region. The proposed shutter device comprises a plate member for opening a shutter for scanning the exposure region in a vertical direction, and a plate member for closing the shutter. By changing the scanning speed of each plate as the edge of the plate passes the exposure region, the exposure time distribution along the vertical direction can be changed as desired.

By using such a shutter 17 in combination with the X-ray mirror 12, any remaining non-uniformness of the illumination intensity, not corrected by the X-ray mirror 12, is corrected, whereby the uniformness of the exposure amount is improved. Further, any change in intensity distribution of the synchrotron radiation light in the vertical direction or a change in photosensitive material on a wafer can be met by adjusting the motion control of the shutter.

When an aspherical mirror and a shutter are used in combination as in the present embodiment, the illumination intensity can be corrected by the shutter even if the reflection surface does not have an aspherical shape providing highest uniformness of illumination intensity. Thus, a small non-uniformness of the reflection surface shape may be allowed. In other words, the aspherical shape may be formed mainly in aiming to reduce the stress during the deformation of the mirror member. The shape of the base member may therefore be determined simply on the basis of estimation of the stress to be produced during deformation of the mirror member.

Embodiment 3

FIGS. 14A and 14B show an embodiment of a reduction projection type X-ray exposure apparatus, wherein FIG. 14A illustrates a general arrangement of the optical system while FIG. 14B illustrates the reduction imaging optical system in an enlarged scale.

Denoted at 101 is an electron accumulation ring; at 102 is an undulator inserted into the ring: at 103 and 104 are mirrors of an illumination optical system; at 105 is a reflection type X-ray mask; at 106, 107 and 108 are mirrors of the reduction imaging optical system; and at 109 is a wafer.

X-rays from the undulator 102 go via the mirrors 103 and 104 of the illumination system, and they illuminate the mask 105 uniformly. The mirrors 103 and 104 each comprises an aspherical surface mirror, having a reflection surface of a desired aspherical shape formed in accordance with the above-described method: that is, a spherical mirror member is pressed against and attached to a base member formed with a desired asphericity.

The pattern formed on the mask 105 is projected and lithographically transferred to the wafer 109 in a reduced scale of 1:5, by means of the reduction imaging optical system which comprises the three mirrors 106, 107 and 108. Each of these mirrors comprises a multilayered mirror based on Bragg's reflection. These mirrors each comprise an aspherical surface mirror, and they provide an imaging optical system of a modified Offner type. The aspherical reflection surface is formed in accordance with the method described hereinbefore.

Embodiment 4

In an optical system using ultraviolet light, there is a large attenuation by glass. Thus, the types of usable glass materials are limited. Additionally, there is a problem of chromatic aberration, depending on the light source used. These problems can be reduced by using an optical system which comprise reflection mirrors.

Figure 15:
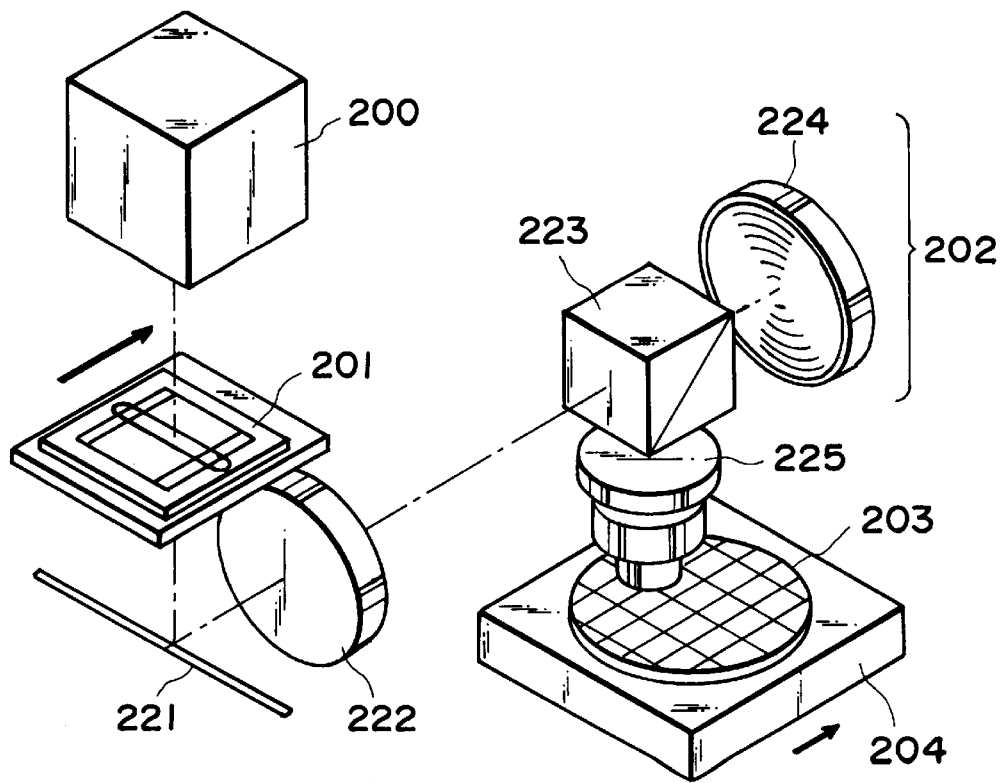
FIG. 15 is a schematic view of an embodiment of an exposure apparatus of a scanning exposure type.

FIG. 15 shows an embodiment of a step-and-scan type ultraviolet exposure apparatus, which uses reflection mirrors. Denoted at 200 is an illumination system including a deep ultraviolet light source, and it produces slit light. Denoted at 201 is a reticle having a pattern formed thereon. Denoted at 202 is an imaging optical system of reflection and refraction type; at 203 is a wafer having a resist (photosensitive material); and at 204 is an X-Y stage for carrying thereon the wafer and moving the same. By means of an unshown driving mechanism, the reticle 201 can be moved as depicted by an arrow in the drawing. The imaging optical system 202 comprises a reflection mirror 221, a refraction lens system 222, a beam splitter 223, an aspherical surface mirror 224 and a refraction lens system 225.

In operation, the stage 201 is first moved to position a certain shot region of the wafer 203. Then, the illumination system 200 operates to project the slit light upon the reticle 201 (slit illumination). In this state, the reticle 204 is moved in a direction perpendicular to the lengthwise direction of the slit light. In synchronism with this, the wafer 203 is moved by the stage 204 in the direction of the arrow. The imaging optical system 202 projects, in a reduced scale, the pattern of the reticle 201 onto the wafer 203, while the scan speed ratio between the reticle and the wafer is equal to the reduction magnification of the imaging optical system 202. In this manner, a first shot region of the wafer 203 is scanned, and the reticle pattern is transferred thereto. After this, the stage is moved stepwise to the subsequent shot region, and the pattern is scanningly transferred thereto in a similar manner.

Figure 16:
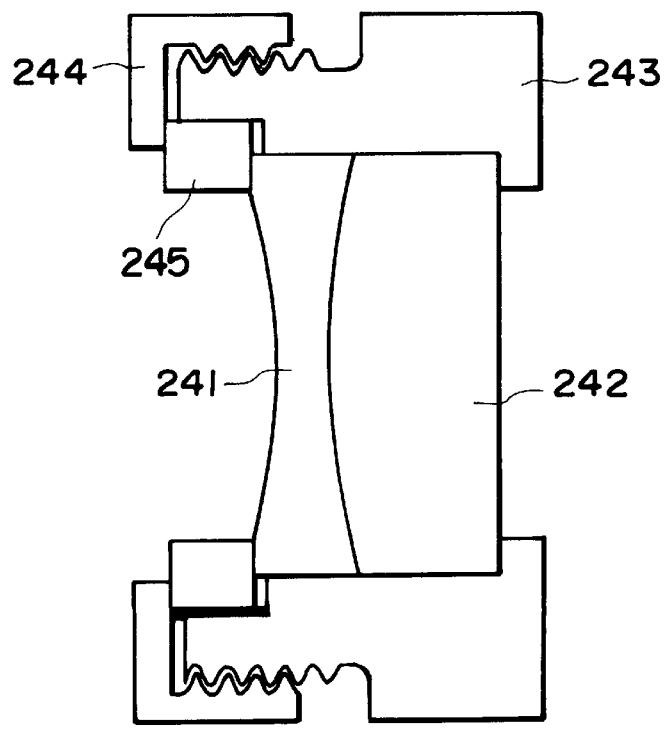
FIG. 16 is a schematic view showing details of the structure of a reflection system.

FIG. 16 illustrates the details of the aspherical mirror 224 in a sectional view. Denoted at 241 is a mirror member having a reflection surface; and at 242 is a base member for holding the mirror member 241. By means of three members, i.e., a barrel member 243, a pressing ring 244 and an intermediate ring 245, the mirror member 241 is deformed so that the bottom surface thereof is intimately contacted to the base surface of the base member 242. Before adhesion, the reflection surface of the mirror member 241 is machined into a spherical shape, and the bottom surface thereof is machined into a flat shape. The base surface of the base member is machined so that, by deformation, the reflection surface of the mirror member 241 is formed into a desired aspherical shape. While in this embodiment, the base surface of the base member 242 is convex, for reduced stress in the mirror member resulting from deformation, the shape of the base member should desirably be close to a sphere and the curvature radius of it should desirably be larger.

Embodiment 5

An embodiment of a device manufacturing method, using an exposure apparatus such as described above, will now be explained.

Figure 17:
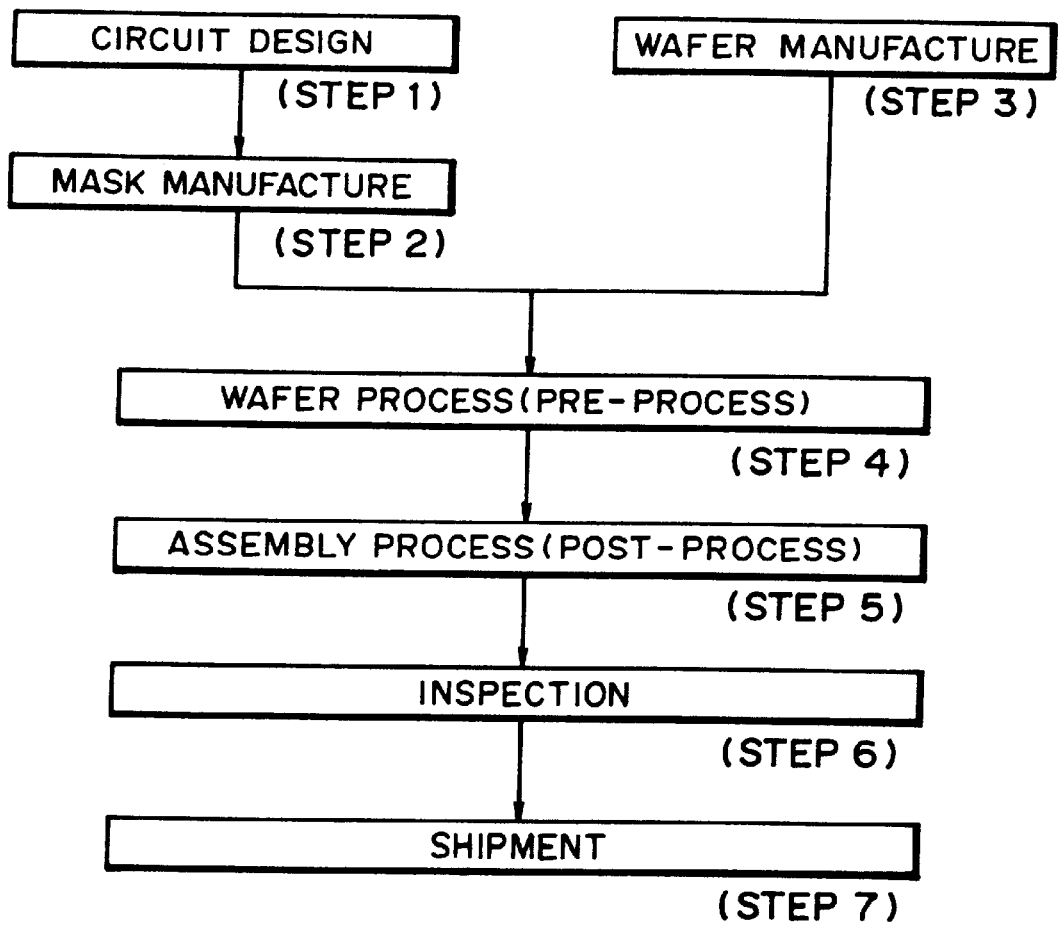
FIG. 17 is a flow chart for explaining device manufacturing processes.

FIG. 17 is a flow chart of the sequence of manufacturing a semiconductor device such as a semiconductor chip (e.g., an IC or an LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process, which is called a pre-process, wherein, by using the so prepared mask and wafer, circuits are practically formed on the wafer through lithography. Step 5 subsequent to this is an assembling step, which is called a post-process, wherein the wafer processed by step 4 is formed into semiconductor chips. This step includes assembling (dicing and bonding) and packaging (chip sealing). Step 6 is an inspection step wherein an operability check, durability check a and so on of the semiconductor devices produced by step 5 are carried out. With these processes. semiconductor devices are finished and they are shipped (step 7).

Figure 18:
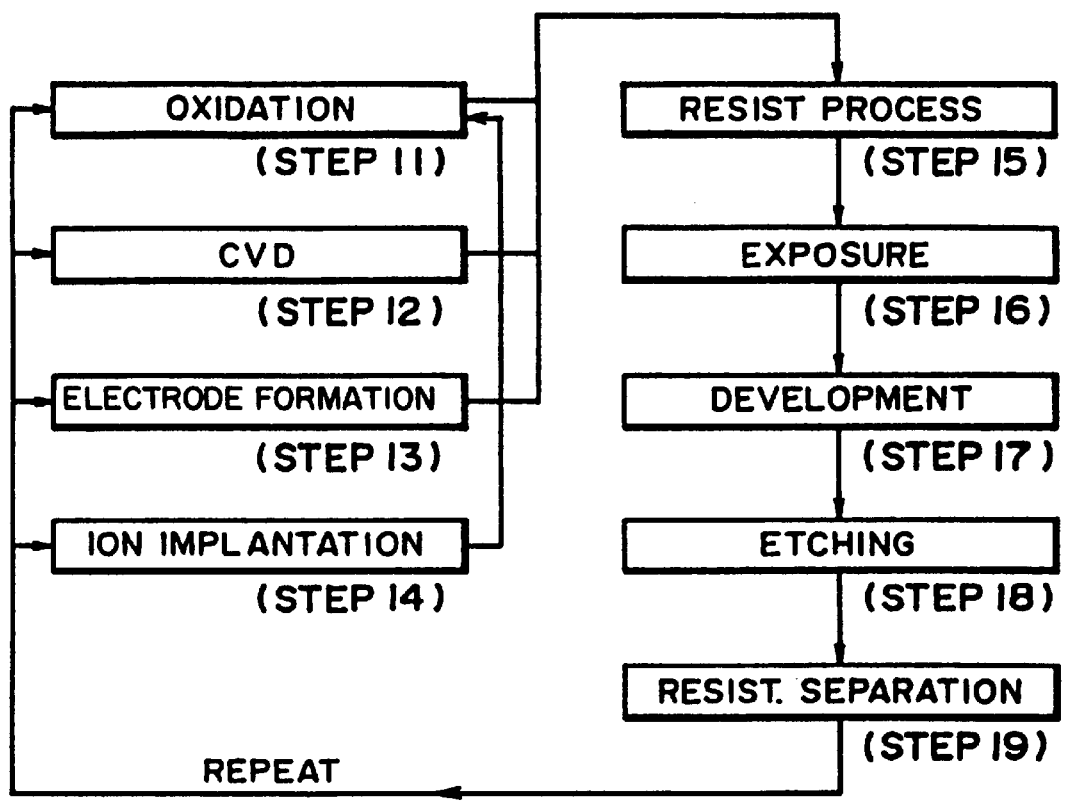
FIG. 18 is a flow chart for explaining details of a wafer process.

FIG. 18 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A reflection system, comprising:

a reflection member with a top surface and a bottom surface, said top surface having a mirror-finished reflection surface of spherical shape;

a base member having a base surface of predetermined shape; and a holder including a holding member and a spring member disposed on both sides of said reflection member for applying a pressing force to the top surface of the reflection member toward the base member, wherein said reflection member and said base member are fixed to each other, with one of the bottom surface of said reflection member and the base surface of said base member being made to follow the other to cause deformation of the spherical shape, whereby the reflection surface is formed into an aspherical shape.

2. A system according to claim 1, further comprising a reinforcing member mounted on said holding member.

3. A system according to claim 1, further comprising a cooling medium flow passageway formed in said base member.

4. A system according to claim 1, wherein the following relation is satisfied:

$$L-Le > \tfrac{1}{2} Le$$

where L is the size of said reflection member in the direction of an optical axis, and Le is the size of the effective region of the reflection surface of said reflection member in the optical axis direction.

5. A system according to claim 1, wherein the following relation is satisfied:

$$L-Le > TM$$

where L is the size of said reflection member in the direction of an optical axis, Le is the size of the effective region of the reflection surface of said reflection member in the optical axis direction, and TM is the thickness of said reflection member.

6. A system according to claim 1, wherein said reflection system is used for reflecting light having a wavelength shorter than that of ultraviolet light.

7. A reflection system, comprising:

a reflection member with a top surface and a bottom surface, said top surface having a mirror-finished reflection surface of cylindrical shape;

a base member having a base surface of predetermined shape; and a holder including a holding member and a spring member disposed on both sides of said reflection member for applying a pressing force to the top surface of the reflection member toward the base member, wherein said reflection member and said base member are fixed to each other, with one of the bottom surface of said reflection member and the base surface of said base member being made to follow the other to cause a local change in curvature of the cylindrical surface shape of the reflection surface.

8. A system according to claim 7, further comprising a reinforcing member mounted on said holding member.

9. A system according to claim 7, further comprising a cooling medium flow passageway formed in said base member.

10. A system according to claim 7, wherein the following relation is satisfied:

$$L-Le > \tfrac{1}{2} Le$$

where L is the size of said reflection member in the direction of an optical axis, and Le is the size of the effective region of the reflection surface of said reflection member in the optical axis direction.

11. A system according to claim 7, wherein the following relation is satisfied:

$$L-Le > TM$$

where L is the size of said reflection member in the direction of an optical axis, Le is the size of the effective region of the reflection surface of said reflection member in the optical axis direction, and TM is the thickness of said reflection member.

12. A system according to claim 7, wherein said reflection system is used for reflecting light having a wavelength shorter than that of ultraviolet light.

* * * * *

UNITED STATES PATENT AND TRADEMARK OFFICE
CERTIFICATE OF CORRECTION

PATENT NO. : 5,975,709

DATED       : November 2, 1999

INVENTOR(S): RYUICHI EBINUMA, ET AL.                    Page 1 of 3

It is certified that error appears in the above-identified patent and that said Letters Patent is hereby corrected as shown below:

ON THE COVER PAGE AT ITEM [57] "ABSTRACT":
Line 1, "system," should read --system--; and
Line 4, "shape; and" should read --shape,--.

COLUMN 1:
Line 8, "Is" should read --is--;
Line 15, "of" should be deleted;
Line 17, "of" should be deleted; and
Line 27, "of" should be deleted.

COLUMN 3:
Line 28, "of" should be deleted.

COLUMN 4:
Line 16, "of" should be deleted;
Line 26, "is" should read --it--; and
Line 67, "d" should read --a--.

UNITED STATES PATENT AND TRADEMARK OFFICE
CERTIFICATE OF CORRECTION

PATENT NO. : 5,975,709

DATED : November 2, 1999

INVENTOR(S): RYUICHI EBINUMA, ET AL.

It is certified that error appears in the above-identified patent and that said Letters Patent is hereby corrected as shown below:

COLUMN 5:
Line 42, "and" should read --end--.

COLUMN 9:
Line 25, "enlarge" should read --to enlarge; and
Line 45, "into this" should read --this into--.

COLUMN 10:
Line 18, "tor" should read --for--;
Line 24, "water." should read --wafer.--; and
Line 49, "2-71508/990" should read --2-71508--.

UNITED STATES PATENT AND TRADEMARK OFFICE
CERTIFICATE OF CORRECTION

PATENT NO. : 5,975,709

DATED : November 2, 1999

INVENTOR(S): RYUICHI EBINUMA, ET AL.

It is certified that error appears in the above-identified patent and that said Letters Patent is hereby corrected as shown below:

COLUMN 11:
Line 50, "comprise" should read --comprises--.

COLUMN 12:
Line 56, "durability check a" should read --a durability check--.

Signed and Sealed this

Twenty-sixth Day of September, 2000

Attest:

Q. TODD DICKINSON

Attesting Officer

Director of Patents and Trademarks